(12) United States Patent
Chu et al.

(10) Patent No.: US 7,902,902 B2
(45) Date of Patent: Mar. 8, 2011

(54) ANTI-FUSE REPAIR CONTROL CIRCUIT FOR PREVENTING STRESS ON CIRCUIT PARTS

(75) Inventors: Shin Ho Chu, Gyeonggi-do (KR); Min Jung Koh, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/964,294

(22) Filed: Dec. 26, 2007

(65) Prior Publication Data

US 2009/0134935 A1 May 28, 2009

(30) Foreign Application Priority Data

Nov. 28, 2007 (KR) ...................... 10-2007-0121942

(51) Int. Cl.
 *H01H 85/00* (2006.01)
(52) U.S. Cl. ...................................... 327/525; 327/537
(58) Field of Classification Search ................. 327/525, 327/526, 534, 535, 537; 365/96, 225.7; 257/530
 See application file for complete search history.

(56) References Cited

U.S. PATENT DOCUMENTS

| | | | | |
|---|---|---|---|---|
| 5,838,624 A * | 11/1998 | Pilling et al. | ............. | 365/225.7 |
| 5,841,723 A * | 11/1998 | Ma | ............. | 365/225.7 |
| 6,091,282 A * | 7/2000 | Kim | ............. | 327/536 |
| 6,108,261 A * | 8/2000 | Kim et al. | ............. | 365/225.7 |
| 6,329,869 B1 * | 12/2001 | Matano | ............. | 327/536 |
| 6,384,666 B1 * | 5/2002 | Bertin et al. | ............. | 327/525 |
| 6,545,926 B2 * | 4/2003 | Ooishi et al. | ............. | 365/225.7 |
| 6,927,997 B2 * | 8/2005 | Lee et al. | ............. | 365/177 |
| 7,075,357 B2 * | 7/2006 | Koshita | ............. | 327/536 |
| 7,130,207 B2 * | 10/2006 | Fricke et al. | ............. | 365/51 |
| 7,196,547 B2 * | 3/2007 | Kozawa | ............. | 326/81 |
| 7,230,475 B2 * | 6/2007 | Choi et al. | ............. | 327/544 |
| 2009/0141577 A1 * | 6/2009 | Chu et al. | ............. | 365/225.7 |

FOREIGN PATENT DOCUMENTS

| | | |
|---|---|---|
| KR | 1020000050452 A | 8/2000 |
| KR | 1020000050453 A | 8/2000 |
| KR | 2000-0062452 A | 10/2000 |

\* cited by examiner

*Primary Examiner* — Lincoln Donovan
*Assistant Examiner* — Sibin Chen
(74) *Attorney, Agent, or Firm* — Ladas & Parry LLP

(57) ABSTRACT

The present invention relates to an anti-fuse repair control circuit which regulates transmission of a power voltage and a back-bias voltage that are converted to repair an anti-fuse to a circuit part. As such, the present invention prevents the influence of a high power voltage or a low back-bias voltage on a circuit part such as a cell, a peripheral circuit, or a core region during an anti-fuse repair. The anti-fuse repair control circuit includes an anti-fuse repair enabling part providing an anti-fuse repair enabling signal corresponding to a repair of an anti-fuse; a power voltage control part controlling transmission of a power voltage to a first circuit part according to an enablement state of the anti-fuse repair enabling signal; and a back-bias voltage control part controlling transmission of a back-bias voltage to a second circuit part according to the enablement state of the anti-fuse repair enabling signal.

18 Claims, 2 Drawing Sheets

US 7,902,902 B2

ANTI-FUSE REPAIR CONTROL CIRCUIT FOR PREVENTING STRESS ON CIRCUIT PARTS

CROSS-REFERENCE TO RELATED APPLICATIONS

The present application claims priority to Korean patent application number 10-2007-0121942 filed on Nov. 28, 2007, which is incorporated herein by reference in its entirety.

BACKGROUND OF THE INVENTION

The present invention relates generally to an anti-fuse repair control circuit, and more particularly to an anti-fuse repair control circuit which regulates transmission of a power voltage and a back-bias voltage that are converted to repair an anti-fuse to a circuit part.

A failure in a packaged semiconductor device can be repaired using an anti-fuse. In the anti-fuse repair method (unlike a prior method in which a fuse is cut using a laser beam) voltages with a large potential difference are applied to both ends of the anti-fuse corresponding to the failed portion in order to melt the anti-fuse.

The abovementioned anti-fuse repair method is typically used in DRAMs for mobile devices of semiconductor apparatuses.

As previously stated, two voltages with a large potential difference are used to repair the anti-fuse. Typically, a low back-bias voltage and a high power voltage are used.

For normal operation, the back-bias voltage may have a level of –0.8V and the power voltage may have a level of 1.8V. For anti-fuse repair, the back-bias voltage is converted to a lower level of –3.5V, and the power voltage is converted to a higher level of 3.5V.

The anti-fuse repair melts the anti-fuse by applying the back-bias voltage converted to the lower level and the power voltage converted to the higher level to both ends of the anti-fuse.

However, when repairing the anti-fuse, a cell, a peripheral circuit, a core region, and the like of a semiconductor device are subject to stress when the power voltage is converted to the higher level or the back-bias voltage is converted to the lower level.

When the power voltage converted to the high level through a driver supplying the power voltage is applied to the cell or the peripheral circuit, the cell or the peripheral circuit is subject to stress caused by the high power voltage, and consequently may be damaged.

Similarly, when the low back-bias voltage is applied to the core region, the core region is subject to stress caused by the low back-bias voltage, and consequently may be damaged.

Therefore, it is necessary to find a method capable of performing the anti-fuse repair without causing stress on the circuit parts of a semiconductor device, such as the cell, the peripheral circuit, and the core region.

SUMMARY OF THE INVENTION

Accordingly, an object of the present invention is to provide an anti-fuse repair control circuit that prevents the influence of a high power voltage on a circuit part, such as a cell or a peripheral circuit, during an anti-fuse repair.

Another object of the present invention is to provide an anti-fuse repair control circuit that prevents the influence of a low back-bias voltage on a circuit part, such as a core, during an anti-fuse repair.

To achieve these objects of the present invention, according to a first aspect of the present invention, there is provided an anti-fuse repair control circuit which includes an anti-fuse repair enabling part providing an anti-fuse repair enabling signal corresponding to a repair of an anti-fuse; a power voltage control part controlling transmission of a power voltage to a first circuit part according to an enablement state of the anti-fuse repair enabling signal; and a back-bias voltage control part controlling transmission of a back-bias voltage to a second circuit part according to the enablement state of the anti-fuse repair enabling signal.

The power voltage control part may include a switching device that is turned off in response to the enablement state of the anti-fuse repair enabling signal, and thus switches the transmission of the power voltage to the first circuit part according to the enablement state of the anti-fuse repair enabling signal.

The back-bias voltage control part may include a back-bias voltage pumping part for pumping the back-bias voltage; a back-bias voltage output control part providing a voltage outputted from the back-bias voltage pumping part as an output control signal depending on the enablement state of the anti-fuse repair enabling signal; and a back-bias voltage output control part selectively outputting the voltage provided from the back-bias voltage pumping part according to the output control signal of the back-bias voltage output control part.

The back-bias voltage pumping part may receive the anti-fuse repair enabling signal and selectively perform the pumping of the back-bias voltage depending on the enablement state of the anti-fuse repair enabling signal.

The back-bias voltage control part may include an input part receiving a pumping control signal generated detecting a level of the back-bias voltage and thus controlling the pumping of the back-bias voltage; wherein, as the output of the input part is input into the back-bias voltage pumping part, and the pumping of the back-bias voltage pumping part is controlled in response to an enablement state of at least one of the pumping control signal and the anti-fuse repair enabling signal.

The back-bias voltage output control part may use the voltage provided from the back-bias voltage pumping part and the power voltage as driving voltages and outputs the output control signal in a disabled state when the anti-fuse repair enabling signal is in an enabled state.

The back-bias voltage output control part may include first and second pull-down devices for performing a pull-down operation with the voltage provided from the back-bias voltage pumping part; a driving control device for switching the power voltage; and first and second pull-up devices for performing a pull-up operation with the power voltage switched by the driving control device, wherein the first pull-up device and the first pull-down device are connected in series and have a first connected node therebetween, the first connected node is connected to a gate of the second pull-down device, the second pull-up device and the second pull-down device are connected in series and have a second connected node therebetween, the second connected node is connected to a gate of the first pull-down device, the anti-fuse enabling signal is respectively applied to the first and second pull-up devices in an opposite enablement state, and either of the first and second nodes acts as an output terminal.

The back-bias voltage output part may be provided with at least one switching device which switches transmission of the voltage provided from the back-bias voltage pumping part to the second circuit part according to the output control signal provided from the back-bias output control part.

A plurality of the switching devices may be provided and connected in parallel.

Preferably, the first circuit part may include at least one of a cell and a peripheral circuit.

Preferably, the second circuit part may include a core region.

Preferably, the anti-fuse repair enabling signal may be enabled when a difference between the power voltage and the back-bias voltage for repairing the anti-fuse is more than 5V.

According to a second aspect of the present invention, there is provided an anti-fuse repair control circuit including an anti-fuse repair enabling part providing an anti-fuse repair enabling signal corresponding to a repair of an anti-fuse; and a power voltage control part controlling transmission of a power voltage to a circuit part according to an enablement of the anti-fuse repair enabling signal.

Preferably, the power voltage control part may include a switching device which is turned off in response to the enablement state of the anti-fuse repair enabling signal, and thus switches the transmission of the power voltage to the circuit part according to the enablement state of the anti-fuse repair enabling signal.

Preferably, the circuit part may include at least one of a cell and a peripheral circuit.

According to a third aspect of the present invention, there is provided an anti-fuse repair control circuit including an anti-fuse repair enabling part providing an anti-fuse repair enabling signal corresponding to a repair of an anti-fuse; and a back-bias voltage control part controlling transmission of a back-bias voltage to a circuit part according to the enablement state of the anti-fuse repair enabling signal.

The back-bias voltage control part may include a back-bias voltage pumping part for pumping the back-bias voltage; a back-bias voltage output control part providing a voltage outputted from the back-bias voltage pumping part as an output control signal depending on the enablement state of the anti-fuse repair enabling signal; and a back-bias voltage output control part selectively outputting the voltage provided from the back-bias voltage pumping part according to the output control signal of the back-bias voltage output control part.

The back-bias voltage pumping part may receive the anti-fuse repair enabling signal and selectively performs the pumping of the back-bias voltage depending on the enablement state of the anti-fuse repair enabling signal.

The back-bias voltage output control part may be provided with an input part receiving a pumping control signal generated by detecting a level of the back-bias voltage and thus controlling the pumping of the back-bias voltage; wherein, the output of the input part is input into the back-bias voltage pumping part, and the pumping of the back-bias voltage pumping part is controlled in response to an enablement state of at least one of the pumping control signal and the anti-fuse repair enabling signal.

Preferably, the back-bias voltage output control part may use the voltage provided from the back-bias voltage pumping part and the power voltage as driving voltages and outputs the output control signal in a disabled state when the anti-fuse repair enabling signal is in an enabled state.

Preferably, the back-bias voltage output control part may include first and second pull-down devices for performing a pull-up operation with the voltage provided from the back-bias voltage driving part; a driving control device for switching the power voltage; and first and second pull-up devices for performing a pull-up operation with the power voltage switched by the driving control device; wherein the first pull-up device and the first pull-down device are connected in series and have a first connected node therebetween, the first connected node is connected to a gate of the second pull-down device, the second pull-up device and the second pull-down device are connected in series and have a second connected node therebetween, the second connected node is connected to a gate of the first pull-down device, the anti-fuse enabling signal is respectively applied to the first and second pull-up devices in an opposite enablement state, and either of the first and second nodes acts as an output terminal.

Preferably, the back-bias voltage output part may be provided with at least one switching device which turns off transmission of the voltage provided from the back-bias voltage pumping part to the second circuit part according to the output control signal provided from the back-bias output control part.

Preferably, the circuit part may include a core region.

According to the present invention, it is possible to prevent an influence of a high power voltage on a circuit part such as a cell or a peripheral circuit during an anti-fuse repair.

Also, it is possible to prevent an influence of a low back-bias voltage on a circuit part such as a core during an anti-fuse repair.

DESCRIPTION OF SPECIFIC EMBODIMENTS

Hereinafter, a preferred embodiment of the present invention will be described in detail with reference to the accompanying drawings.

The present invention provides a circuit that prevents a high power voltage VDD (hereinafter, referred to as VDD) or a low back-bias voltage VBB (hereinafter, referred to as VBB), which are used to repair an anti-fuse, from causing stress circuit parts other than the anti-fuse during the anti-fuse repair in a semiconductor device such as a DRAM for mobile devices.

Figure 1:
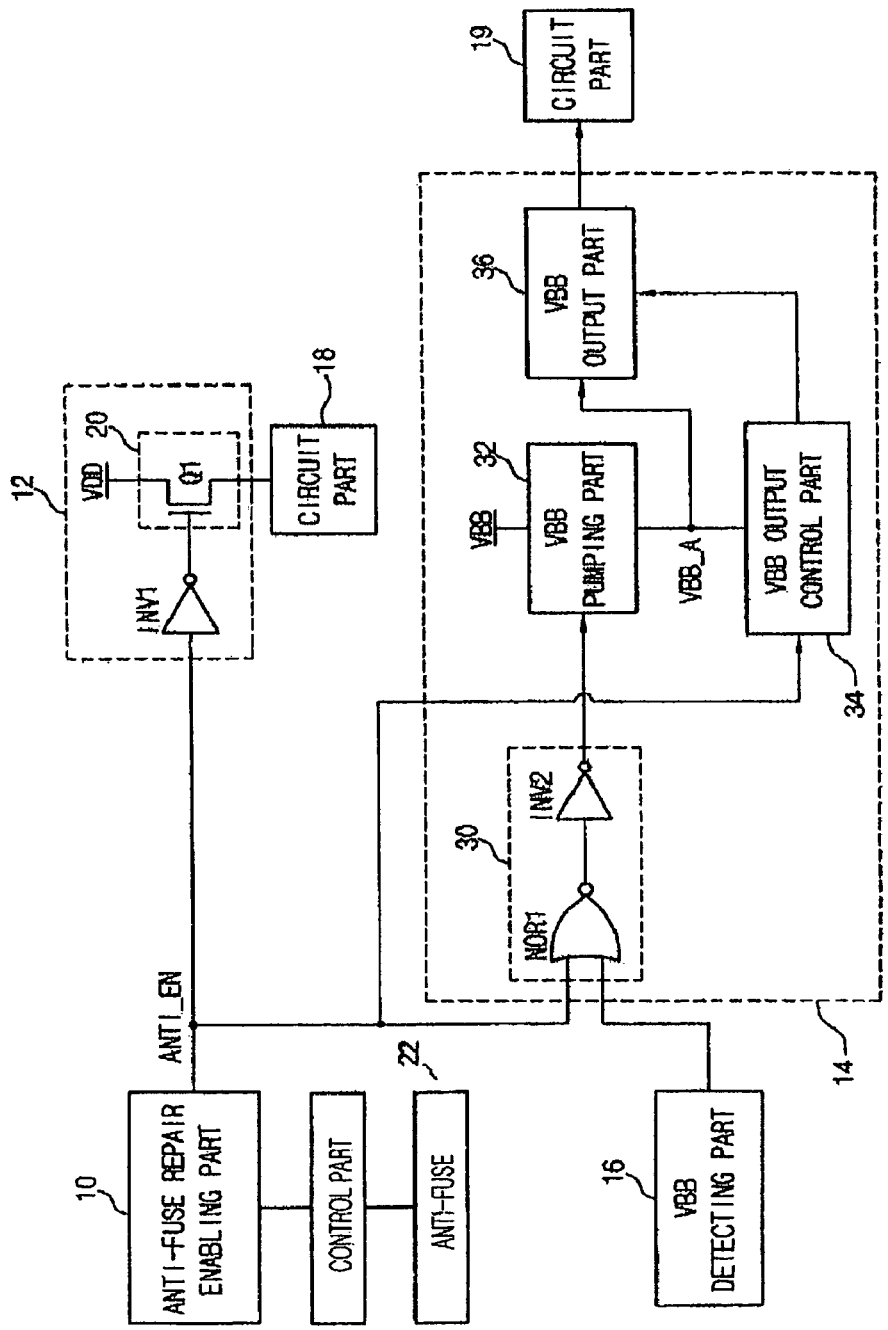
FIG. 1 is a block diagram showing an anti-fuse repair control circuit according to a preferred embodiment of the present invention.

Referring to FIG. 1, an anti-fuse repair control circuit according to an embodiment of the present invention is provided with an anti-fuse repair enabling part 10, a VDD control part 12, a VBB control part 14, a VBB detecting part 16, and circuit parts 18 and 19.

The anti-fuse repair enabling part 10 provides an anti-fuse repair enabling signal ANTI_EN, and the anti-fuse repair enabling signal ANTI_EN may be generated and provided by a setting provided by an extended mode resister set EMRS, a mode resister set MRS, or an external control signal.

The VDD control part 12 controls transmission of the VDD to the circuit part 18 according to the anti-fuse repair enabling signal ANTI_EN. The VDD control part 12 is provided with an inverter INV1, which converts the anti-fuse repair enabling signal ANTI_EN received from the anti-fuse repair enabling part 10 and a switching device 20, which is switched according to the output of the inverter INV1. The switching device 20 includes an NMOS transistor Q1 that switches the application of the VDD to the circuit part 18 as the output of the inverter INV1 is applied to the gate of the NMOS transistor Q1. Herein, the circuit part 18 may include a cell or a peripheral circuit. Further, the VDD that is converted, for example, from 1.8V to 3.5V, may be provided to repair the anti-fuse 22.

The VBB control part 14 includes an input part 30, a VBB pumping part 32, a VBB output control part 34, and a VBB output part 36. The anti-fuse repair enabling signal ANTI_EN is input into the input part 30 and the VBB output control part 34.

Additionally, a detection signal provided by the VBB detecting part 16 is input into the input part 30 of the VBB control part 14. The VBB detecting part 16 detects the level of VBB and outputs a detection signal having a value corresponding to the detection result to control pumping of VBB.

The input part 30 is provided with a NOR gate NOR1 and an inverter INV2 which are connected in series, and the NOR gate NOR1 receives the anti-fuse repair enabling signal ANTI_EN and the detection signal of the VBB detecting part 16. The NOR gate NOR1 outputs a low level signal when either of the inputs is in an enabled state, and the inverter INV2 inverts the output of the NOR gate NOR1. Namely, the input part 30 outputs a high level signal when it is necessary to pump the VBB. The VBB level is raised in the VBB pumping part 32, and it is necessary to pump the VBB in order to obtain the lower VBB for the anti-fuse repair.

The VBB pumping part 32 performs the pumping of the VBB according to the level of the output of the input part 30. For example, the VBB pumping part 32 pumps a VBB of −1.8V during normal operation and a VBB of −3.5V during anti-fuse repair. As one can see, the level of VBB for the anti-fuse repair is much lower than the level of VBB for normal operation.

As previously described, the VBB pumping part 32 performs the pumping operation for normal operation or anti-fuse repair. The output of the VBB pumping part 32 is a pumped voltage VBB_A; i.e., a normal VBB or a VBB lower than the normal VBB.

The VBB output control part 34 is pull-down driven by the level of the VBB_A (which is pumped by and output from the VBB pumping part 32) to vary an output current, and the VBB output control part 34 outputs a signal which is the anti-fuse repair enabling signal ANTI_EN inverted according to the current control.

Using the output of the VBB output control part 34, the VBB output part 36, when in the normal mode, allows the VBB pumped in the VBB pumping part 32 to be transmitted to the circuit part 19, but prevents the transmission of the low VBB pumped in the VBB pumping part 32 for the anti-fuse repair.

The structures of the VBB output control part 34 and the VBB output part 36 will be described in more detail with reference to FIG. 2.

The VBB output control part 34 includes: NMOS transistors N1 and N2 as a device that performs a pull-down operation with the VBB_A provided from the VBB pumping part 32; PMOS transistors P1 and P2 as a device that performs a pull-up operation with the VDD; and a PMOS transistor P3 as a driving control device that switches the power voltage. Herein, the PMOS transistor P1 and the NMOS transistor N1 are connected in series; the PMOS transistor P2 and the NMOS transistor N2 are connected in series; the node between the PMOS transistor P1 and NMOS transistor N1 is connected to the gate of the NMOS transistor N2; and the node between the PMOS transistor P2 and NMOS transistor N2 is connected to the gate of the NMOS transistor N1. Also, VDD is applied to the PMOS transistors P1 and P2 through the PMOS transistor P3; the operation of the PMOS transistor P3 is controlled by the anti-fuse repair enabling signal ANTI_EN; the anti-fuse repair enabling signal ANTI_EN transmitted through the inverter INV3 is applied to the gate of the PMOS transistor P1; and the anti-fuse repair enabling signal ANTI_EN transmitted through the inverter INV3 and the inverter INV4 is applied to the gate of the PMOS transistor P2. Further, VDD is applied as the bulk voltage of the PMOS transistors P1 and P2.

Therefore, the VBB output control part 34 outputs an output control signal corresponding to an enabled or disabled state of the anti-fuse repair enabling signal ANTI_EN.

Then, NMOS transistors N3, N4, and N5 are connected in parallel in the VBB output part 36. The VBB output part 36 transmits a VBB. The VBB transmitted by the VBB output part is the VBB_A (which is applied from the VBB pumping part 32) according to the level of the output control signal output from the VBB output control part 34. Herein, the circuit part 19 includes a core region.

Figure 2:
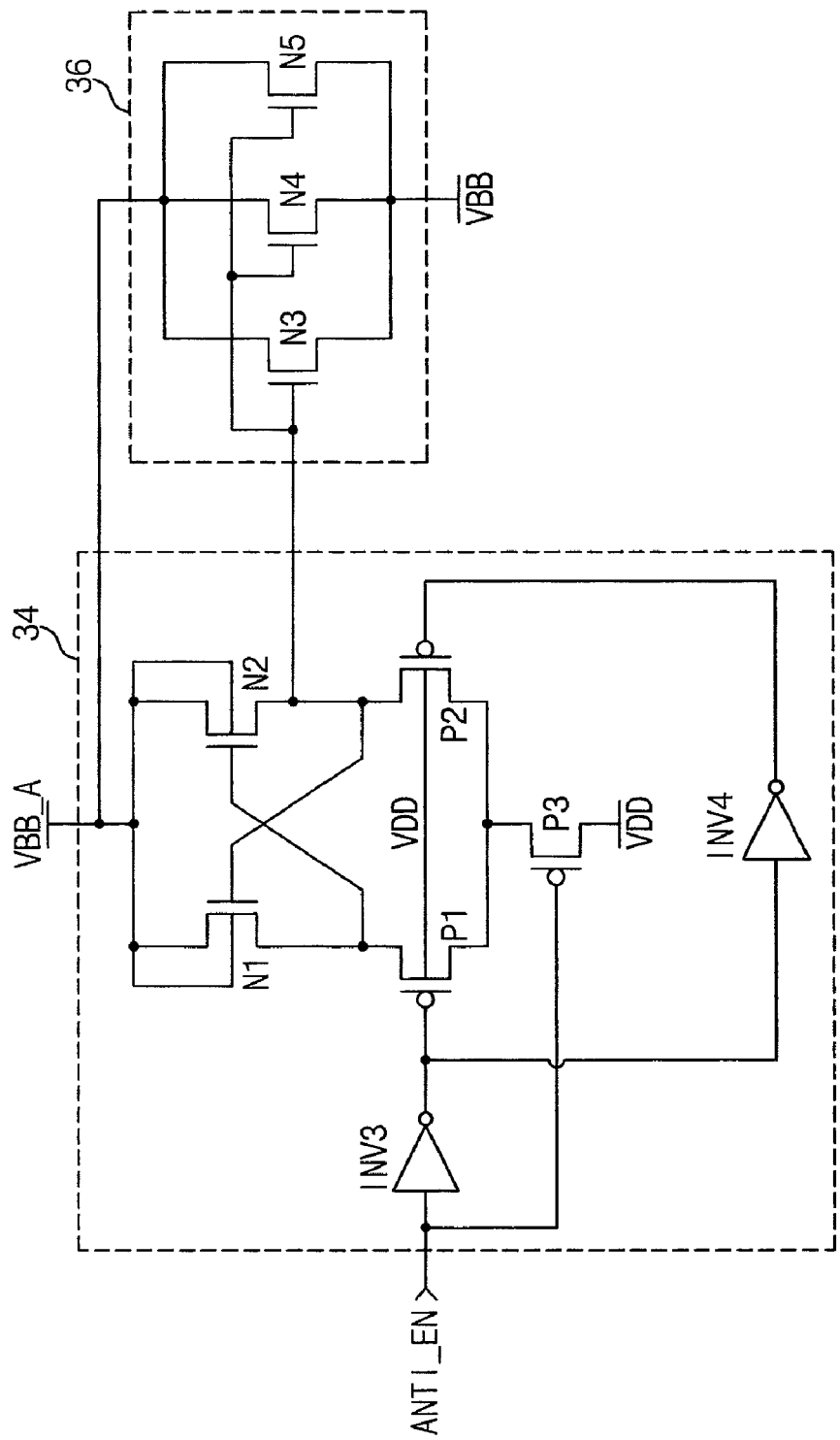
FIG. 2 is a circuit diagram showing in detail a VBB output control part and the VBB output part shown in FIG. 1.

According to the present invention as shown in FIGS. 1 and 2, it is possible to prevent the high VDD or the low VBB generated for the repair from being applied to the cell, the peripheral circuit, or the core region to cause the stress in a state that the anti-fuse repair operation is enabled.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An anti-fuse repair control circuit comprising:
   an anti-fuse repair enabling part configured to generate and provide an anti-fuse repair enabling signal corresponding to a repair of an anti-fuse during the repair of the anti-fuse;
   a power voltage control part configured to prevent transmission of a power voltage to a first circuit part during the repair of the anti-fuse in response to an enablement state of the anti-fuse repair enabling signal; and
   a back-bias voltage control part configured to prevent transmission of a back-bias voltage to a second circuit part during the repair of the anti-fuse in response to the enablement state of the anti-fuse repair enabling signal,
   wherein the back-bias voltage control part comprises:
   a back-bias voltage pumping part for pumping the back-bias voltage;
   a back-bias voltage output control part providing an output control signal depending on the enablement state of the anti-fuse repair enabling signal; and
   a back-bias voltage output part selectively outputting the voltage provided from the back-bias voltage pumping part in response to the output control signal provided from the back-bias voltage output control part.

2. The anti-fuse repair control circuit of claim 1, wherein the power voltage control part includes a switching device which is switched in response to the enablement state of the anti-fuse repair enabling signal, such that the transmission of the power voltage to the first circuit part occurs according to the enablement state of the anti-fuse repair enabling signal.

3. The anti-fuse repair control circuit of claim 1, wherein the back-bias voltage pumping part receives the anti-fuse repair enabling signal and selectively performs the pumping of the back-bias voltage depending on the enablement state of the anti-fuse repair enabling signal.

4. The anti-fuse repair control circuit of claim 1, wherein the back-bias voltage control part includes an input part receiving a pumping control signal generated by detecting a level of the back-bias voltage and thus controlling the pumping of the back-bias voltage, wherein, the output of the input part is input into the back-bias voltage pumping part, and the pumping of the back-bias voltage pumping part is controlled in response to an enablement state of at least one of the pumping control signal and the anti-fuse repair enabling signal.

5. The anti-fuse repair control circuit of claim 1, wherein the back-bias voltage output control part uses the voltage provided from the back-bias voltage pumping part and the power voltage as driving voltages and outputs the output control signal in a disabled state when the anti-fuse repair enabling signal is in an enabled state.

6. The anti-fuse repair control circuit of claim 1, wherein the back-bias voltage output control part includes:
   first and second pull-down devices for performing a pull-down operation with the voltage provided from the back-bias voltage pumping part;
   a driving control device for switching the power voltage; and
   first and second pull-up devices for performing a pull-up operation with the power voltage switched by the driving control device,
   wherein the first pull-up device and the first pull-down device are connected in series and have a first connected node therebetween, the first connected node is connected to a gate of the second pull-down device, the second pull-up device and the second pull-down device are connected in series and have a second connected node therebetween, the second connected node is connected to a gate of the first pull-down device, the anti-fuse enabling signal is respectively applied to the first and second pull-up devices in an opposite enablement state, and either of the first and second nodes acts as an output terminal.

7. The anti-fuse repair control circuit of claim 1, wherein the back-bias voltage output part is provided with at least one switching device which switches transmission of the voltage provided from the back-bias voltage pumping part to the second circuit part according to the output control signal provided from the back-bias output control part.

8. The anti-fuse repair control circuit of claim 7, wherein a plurality of the switching devices is provided and the switching devices are connected in parallel.

9. The anti-fuse repair control circuit of claim 1, wherein the first circuit part includes at least one of a cell and a peripheral circuit.

10. The anti-fuse repair control circuit of claim 1, wherein the second circuit part includes a core region.

11. The anti-fuse repair control circuit of claim 1, wherein the anti-fuse repair enabling signal is enabled when a difference between the power voltage and the back-bias voltage for repairing the anti-fuse is more than 5V.

12. An anti-fuse repair control circuit, comprising:
   an anti-fuse repair enabling part configured to generate and provide an anti-fuse repair enabling signal corresponding to a repair of an anti-fuse during the repair of the anti-fuse; and
   a back-bias voltage control part configured to pump a back bias voltage depending on the anti-fuse repair enabling signal and to prevent transmission of the back-bias voltage to a circuit part in response to the enablement state of the anti-fuse repair enabling signal,
wherein the back-bias voltage control part includes:
   a back-bias voltage pumping part for pumping the back-bias voltage;
   a back-bias voltage output control part providing an output control signal depending on the enablement state of the anti-fuse repair enabling signal; and
   a back-bias voltage output part selectively outputting the voltage provided from the back-bias voltage pumping part in response to the output control signal provided from the back-bias voltage output control part.

13. The anti-fuse repair control circuit of claim 12, wherein the back-bias voltage pumping part receives the anti-fuse repair enabling signal and selectively performs selectively the pumping of the back-bias voltage depending on the enablement state of the anti-fuse repair enabling signal.

14. The anti-fuse repair control circuit of claim 12, wherein the back-bias voltage control part includes an input part receiving a pumping control signal generated by detecting a level of the back-bias voltage and thus controlling the pumping of the back-bias voltage,
   wherein, the output of the input part is input into the back-bias voltage pumping part, and the pumping of the back-bias voltage pumping part is controlled in response to an enablement state of at least one of the pumping control signal and the anti-fuse repair enabling signal.

15. The anti-fuse repair control circuit of claim 12, wherein the back-bias voltage output control part uses the voltage provided from the back-bias voltage pumping part and the power voltage as driving voltages and outputs the output control signal in a disabled state when the anti-fuse repair enabling signal is in an enabled state.

16. The anti-fuse repair control circuit as set forth in claim 12, wherein the back-bias voltage output control part includes:
   first and second pull-down devices for performing a pull-up operation with the voltage provided from the back-bias voltage driving part;
   a driving control device for switching the power voltage; and
   first and second pull-up devices for performing a pull-up operation with the power voltage switched by the driving control device,
   wherein the first pull-up device and the first pull-down device are connected in series and have a first connected node therebetween, the first connected node is connected to a gate of the second pull-down device, the second pull-up device and the second pull-down device are connected in series and have a second connected node therebetween, the second connected node is connected to a gate of the first pull-down device, the anti-fuse enabling signal is respectively applied to the first and second pull-up devices in an opposite enablement state, and either of the first and second nodes acts as an output terminal.

17. The anti-fuse repair control circuit of claim 12, wherein the back-bias voltage output part is provided with at least one switching device which switches transmission of the voltage provided from the back-bias voltage pumping part to the second circuit part according to the output control signal provided from the back-bias output control part.

18. The anti-fuse repair control circuit of claim 12, wherein the circuit part includes a core region.

* * * * *